United States Patent
Hidaka et al.

(10) Patent No.: US 11,362,257 B2
(45) Date of Patent: Jun. 14, 2022

(54) QUANTUM BIT DEVICE

(71) Applicant: NATIONAL INSTITUTE OF ADVANCED INDUSTRIAL SCIENCE AND TECHNOLOGY, Tokyo (JP)

(72) Inventors: Mutsuo Hidaka, Tsukuba (JP); Masaaki Maezawa, Tsukuba (JP)

(73) Assignee: NATIONAL INSTITUTE OF ADVANCED INDUSTRIAL SCIENCE AND TECHNOLOGY

( * ) Notice: Subject to any disclaimer, the term of this patent is extended or adjusted under 35 U.S.C. 154(b) by 100 days.

(21) Appl. No.: 16/613,252

(22) PCT Filed: May 9, 2018

(86) PCT No.: PCT/JP2018/017962
§ 371 (c)(1),
(2) Date: Nov. 13, 2019

(87) PCT Pub. No.: WO2018/212041
PCT Pub. Date: Nov. 22, 2018

(65) Prior Publication Data
US 2021/0167271 A1 Jun. 3, 2021

(30) Foreign Application Priority Data
May 16, 2017 (JP) .............................. JP2017-097658

(51) Int. Cl.
*H01L 39/22* (2006.01)
*G06N 10/00* (2022.01)
(Continued)

(52) U.S. Cl.
CPC ............. *H01L 39/22* (2013.01); *G06N 10/00* (2019.01); *H01L 23/53285* (2013.01);
(Continued)

(58) Field of Classification Search
CPC ..... H01L 39/22; H01L 39/223; H01L 39/025; H01L 23/53285; H01L 2224/16225;
(Continued)

(56) References Cited

U.S. PATENT DOCUMENTS

| 6,613,463 B1 | 9/2003 | Izumi et al. ................. 428/700 |
| 2009/0173936 A1* | 7/2009 | Bunyk .................... B82Y 10/00 257/31 |
| 2018/0013052 A1* | 1/2018 | Oliver ................. H01L 25/0652 |

FOREIGN PATENT DOCUMENTS

| JP | 06-318741 A | 11/1994 |
| JP | 2001-101930 A | 4/2001 |

(Continued)

OTHER PUBLICATIONS

International Search Report dated Jul. 17, 2018 in corresponding PCT International Application No. PCT/JP2018/017962.
(Continued)

*Primary Examiner* — Ermias T Woldegeorgis
(74) *Attorney, Agent, or Firm* — Ostrolenk Faber LLP

(57) ABSTRACT

A quantum bit device according to the present invention includes a first quantum bit substrate 10 which includes a first superconductive wiring 13 disposed to have a magnetically coupled portion with a first superconductive magnetic flux quantum bit 14 on a surface thereof, a second quantum bit substrate 11 which includes a second superconductive wiring 13 disposed to have a magnetically coupled portion with a second superconductive magnetic flux quantum bit 14 on a surface thereof, and a base substrate 12 which includes a third superconductive wiring 13 configured by two superconductive wirings extending parallel to each other on a surface thereof. The first and second quantum bit substrates are placed on the base substrate, two end portions of the first superconductive wiring and two end portions on one side of the third superconductive wiring are joined via supercon-
(Continued)

ductive solders 15, two end portions of the second superconductive wiring and two end portions on the other side of the third superconductive wiring are joined via superconductive solders 15, and three of the first to third superconductive wirings form one continuous superconductive loop.

7 Claims, 9 Drawing Sheets

(51) Int. Cl.
     *H01L 23/532*       (2006.01)
     *H01L 25/04*       (2014.01)
     *H01L 25/18*       (2006.01)
     *H01L 25/065*       (2006.01)
     *H01L 25/07*       (2006.01)

(52) U.S. Cl.
     CPC ............ *H01L 25/04* (2013.01); *H01L 25/065* (2013.01); *H01L 25/07* (2013.01); *H01L 25/18* (2013.01); *H01L 39/223* (2013.01)

(58) Field of Classification Search
     CPC ....... H01L 25/04; H01L 25/065; H01L 25/07; H01L 25/18; G06N 10/00
     See application file for complete search history.

(56) References Cited

FOREIGN PATENT DOCUMENTS

JP       2014-099591 A       5/2014
JP       2015-015590 A       1/2015

OTHER PUBLICATIONS

Written Opinion dated Jul. 17, 2018 in corresponding PCT International Application No. PCT/JP2018/017962.

T. Yamamoto et al. "Josephson Effect and Quantum Bits," IEICE, vol. 95, pp. 750-753, 2012 (with partial English translation).

The D-Wave 2000Q™ System, URL address: https://www.dwavesys.com/d-wave-two-system; download date: Oct. 25, 2019.

W. Oliver, "Quantum Enhanced Optimization: Experimental Study Overview," (https://www.iarpa.gov/images/files/programs/qeo/MIT_Lincoln_Laboratory_proposers_day_presentation_Will_Oliver.pdf), Oct. 26, 2015.

Cadence Design Systems, Japan, The Sound of Cadence Sep. 2011, vol. 2 (https://www.cadence.co.jp/soconline/vol2/tec4/all.html) (with partial English translation).

\* cited by examiner

QUANTUM BIT DEVICE

CROSS-REFERENCE TO RELATED APPLICATIONS

The present application is a 35 U.S.C. §§ 371 national phase conversion of PCT/JP2018/017962, filed May 9, 2018, which claims priority to Japanese Patent Application No. 2017-097658, filed May 16, 2017, the contents of which are incorporated herein by reference. The PCT International Application was published in the Japanese language.

TECHNICAL FIELD

The present invention relates to a quantum bit device using a quantum bit, in which a quantum mechanical superposition state is used, as an information carrier.

BACKGROUND ART

As an information processing device using quantum bits, a quantum annealing machine that solves an optimization problem using the fact that a state of network-connected quantum bits converges to a certain stable state according to a coupling method or a strength of coupling is known. A quantum bit used in a conventional quantum annealing machine stores a single magnetic flux quantum ($\Phi 0 = 2.07 \times 10^{-15}$ Wb) in a superconductive loop having Josephson junctions and is called a magnetic flux quantum bit.

A superconductive loop, which is a closed loop configured by superconductors, is used for coupling the magnetic flux quantum bits. The superconductive loop has a property in which a shielding current circulating in the loop flows when a magnetic field is applied from the outside due to a diamagnetic effect of the superconductors. Therefore, when a magnetic flux quantum bit is magnetically coupled to the superconductive loop, a shielding current according to a state of the magnetic flux quantum bit flows in the superconductive loop and can affect a state of another magnetic flux quantum bit that is magnetically coupled to the superconductive loop in the same way. With this method, a coupling between different magnetic flux quantum bits can be made.

As described in Non-Patent Literature 1, a magnetic flux quantum bit requires relatively large inductance of about 100 pH to form a double well potential, and even if equivalent inductance of a Josephson junction is used effectively, a superconductive loop cannot be made very small. As a result, there is a problem in that the number of quantum bits that can be mounted on one substrate is limited to tens of thousands at most. For example, as described in Non-Patent Literature 2, a quantum annealing machine has been commercialized as a quantum computer (for example, "D-Wave 2000Q" (registered trademark)) using superconductors by D-Wave Systems Inc. in Canada. However, the number of quantum bits used is about 2000, and there is a problem in that the scale is overwhelmingly small compared to the one million quantum bits that are said to be necessary for solving the practical problems.

As a device structure that configures a quantum bit circuit using a plurality of substrates, a device structure described in Non-Patent Literature 3 is known. In this device, a quantum bit substrate on which spin quantum bits are mounted is placed on a magnetic coupling coupler provided on a separate substrate, and the magnetic coupling coupler is coupled to a wiring on a separate substrate through a through-via. This device structure has an advantage in that the number of quantum bits that can be integrated on one substrate can be improved by introducing a three-dimensional device structure such as flip-chip connections and through-vias to a quantum bit circuit and reducing an area load on the quantum bit substrate due to the magnetic coupling coupler and a wiring circuit. However, the flip-chip connection between the quantum bit substrate and the magnetic coupling coupler substrate is 1:1 connection, and the number of quantum bits cannot be increased more than that of one quantum bit substrate.

As described in Non-Patent Literature 4, in semiconductor devices, a three-dimensional device structure in which a plurality of substrates are flip-chip connected on a larger substrate called an interposer and the interposer is connected to a wiring pattern on a printed circuit board through a through-via is known. Further, a method called a bridging block contact in which adjacent interposers are connected by a flip-chip connection as described in Patent Literature 1 is also known. When these methods are used, a device scale can be extended in a horizontal direction without staying within one substrate.

As described above, a magnetic connection circuit using a superconductive loop needs to be used for coupling magnetic flux quantum bits. The magnetic connection circuit using the superconductive loop is the only practical method for connection to another magnetic flux quantum bit without damaging a quantum state of a magnetic flux quantum bit. Therefore, when the device structure used in semiconductor devices is introduced into connections of a plurality of quantum bit substrates, there is a problem in that quantum bits on different substrates cannot be coupled by the method of connecting them with a normal conductor wiring used in semiconductor devices.

CITATION LIST

Patent Literature

[Patent Literature 1]
Japanese Unexamined Patent Application, First Publication No. 2014-99591

Non Patent Literature

[Non Patent Literature 1]
Tsuyoshi Yamamoto, "Josephson effect and quantum bits," The Institute of Electronics, Information and Communication Engineers (IEICE), Vol. 95, pp. 750-753, 2012

[Non Patent Literature 2]
D-Wave Systems Inc. in Canada, website: (http://www.d-wavesys.com/)

[Non Patent Literature 3]
W. Oliver, "Quantum Enhanced Optimization: Experimental Study Overview," Oct. 26, 2015
(https://www.iarpa.gov/images/files/programs/qeo/MIT_Lincoln_Laboratory_pr oposers_day_presentation-_Will_Oliver.pdf)

[Non Patent Literature 4]
Electronic Information Technology Magazine "The Sound of Cadence" September 2011 Vol. 2 (https://www.cadence.co.jp/soconline/vol2/tec4/all.html)

SUMMARY OF INVENTION

Technical Problem

An objective of the present invention is directed to solving the above-described problems of conventional technologies and providing a quantum bit device having expandability.

Solution to Problem

A quantum bit device of one aspect of the present invention includes a first quantum bit substrate which includes a first superconductive wiring disposed to have a magnetically coupled portion with a first superconductive magnetic flux quantum bit on a surface thereof, a second quantum bit substrate which includes a second superconductive wiring disposed to have a magnetically coupled portion with a second superconductive magnetic flux quantum bit on a surface thereof, and a base substrate which includes a third superconductive wiring configured by two superconductive wirings extending parallel to each other on a surface thereof. The first and second quantum bit substrates are placed on the base substrate, two end portions of the first superconductive wiring and two end portions on one side of the third superconductive wiring are joined via superconductive solders, two end portions of the second superconductive wiring and two end portions on the other side of the third superconductive wiring are joined via superconductive solders, and three of the first to third superconductive wirings form one continuous superconductive loop.

A quantum bit device of another aspect of the present invention includes a first quantum bit substrate which includes a first superconductive loop having a superconductive wiring forming one closed loop disposed to have a magnetically coupled portion with a first superconductive magnetic flux quantum bit on a surface thereof, a second quantum bit substrate which includes a second superconductive loop having a superconductive wiring forming one closed loop disposed to have a magnetically coupled portion with a second superconductive magnetic flux quantum bit on a surface thereof, and a base substrate which includes a third superconductive loop having a superconductive wiring forming one closed loop on a surface thereof. The first quantum bit substrate and the second quantum bit substrate are flip-chip connected on the base substrate so that the respective surfaces face the surface of the base substrate, and the first and second superconductive loops are able to be magnetically coupled to the third superconductive loop with an air gap therebetween.

A quantum bit device of another aspect of the present invention includes a first quantum bit substrate which includes a first superconductive wiring disposed to have a magnetically coupled portion with a first superconductive magnetic flux quantum bit on a surface thereof, a second quantum bit substrate which includes a second superconductive wiring disposed to have a magnetically coupled portion with a second superconductive magnetic flux quantum bit on a surface thereof, and a connection substrate including a third superconductive wiring configured by two superconductive wirings extending parallel to each other on a surface thereof and having a size smaller than those of the first and second quantum bit substrates. The connection substrate is placed so that the surface faces the surfaces of the first and second quantum bit substrates and straddles the first quantum bit substrate and the second quantum bit substrate, two end portions of the first superconductive wiring and two end portions on one side of the third superconductive wiring are joined via superconductive solders, two end portions of the second superconductive wiring and two end portions on the other side of the third superconductive wiring are joined via superconductive solders, and three of the first to third superconductive wirings form one continuous superconductive loop.

A quantum bit device of another aspect of the present invention includes a first quantum bit substrate which includes a first superconductive loop having a superconductive wiring forming one closed loop disposed to have a magnetically coupled portion with a first superconductive magnetic flux quantum bit on a surface thereof, a second quantum bit substrate which includes a second superconductive loop having a superconductive wiring forming one closed loop disposed to have a magnetically coupled portion with a second superconductive magnetic flux quantum bit on a surface thereof, and a connection substrate which includes a third superconductive loop having a superconductive wiring forming one closed loop on a surface thereof and having a size smaller than those of the first and second quantum bit substrates. The connection substrate is flip-chip connected on the first and second quantum bit substrates so that the surface faces the surfaces of the first and second quantum bit substrates and straddles the first quantum bit substrate and the second quantum bit substrate, and the first and second superconductive loops are able to be magnetically coupled to the third superconductive loop with an air gap therebetween.

A quantum bit device of another aspect of the present invention includes a first quantum bit substrate which includes a first superconductive wiring disposed to have a magnetically coupled portion with a first superconductive magnetic flux quantum bit on a surface thereof, a second quantum bit substrate which includes a second superconductive wiring disposed to have a magnetically coupled portion with a second superconductive magnetic flux quantum bit on a surface thereof, an interposer substrate including a third superconductive wiring configured by two superconductive wirings extending parallel to each other on a surface thereof, and a base substrate on which the interposer substrate is placed. The first and second quantum bit substrates are placed on the interposer substrate, two end portions of the first superconductive wiring and two end portions on one side of the third superconductive wiring are joined via superconductive solders, two end portions of the second superconductive wiring and two end portions on the other side of the third superconductive wiring are joined via superconductive solders, three of the first to third superconductive wirings form one continuous superconductive loop, and a wiring on the base substrate is connected to a through conductive via in the interposer substrate and a wiring thereon via a solder.

DESCRIPTION OF EMBODIMENTS

Hereinafter, embodiments of the present invention will be described with reference to the drawings.

First Embodiment

Figure 1:
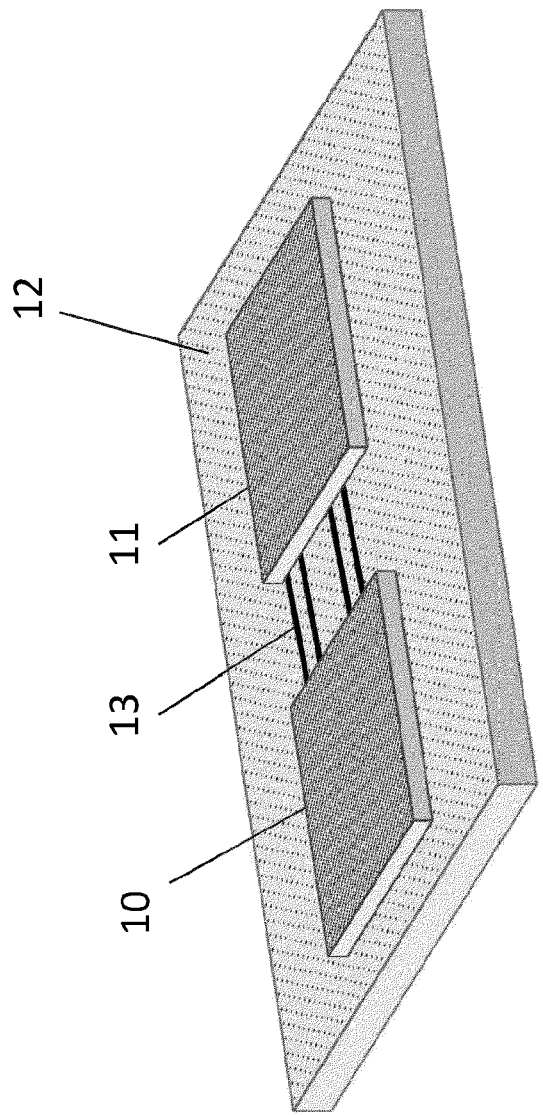
FIG. 1 is a perspective view of a quantum bit device of a first embodiment and a second embodiment.
Figure 2:
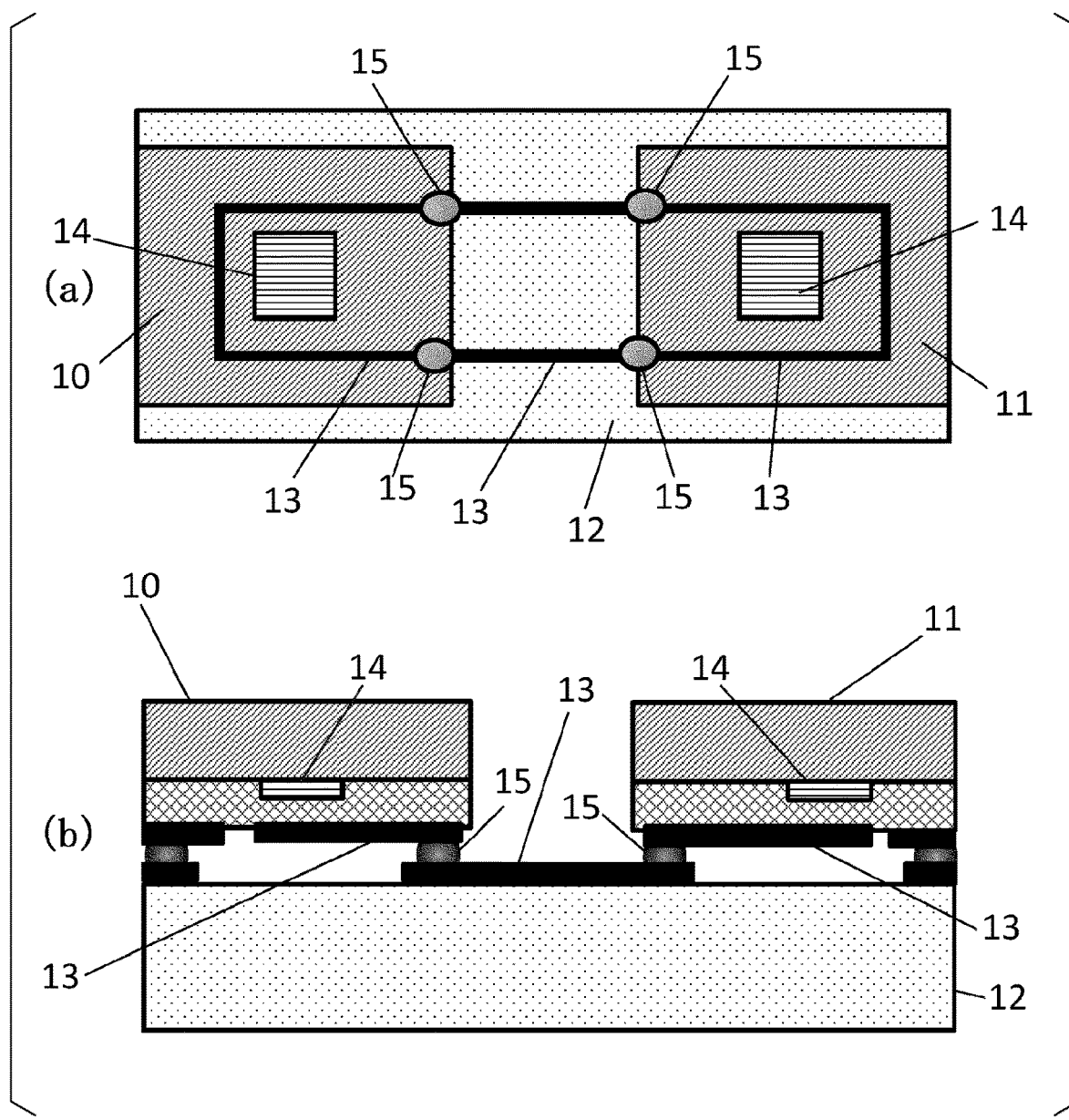
FIG. 2(a) is a top view and FIG. 2(b) is a cross-sectional view of the quantum bit device of the first embodiment.

A quantum bit device of a first embodiment of the present invention will be described with reference to FIGS. 1 and 2. FIG. 1 is a perspective view illustrating an overview of a structure of the quantum bit device (hereinafter also simply referred to as a "device") of the first embodiment, and FIG. 2(a) is a top view and FIG. 2(b) a cross-sectional view of a central portion of FIG. 1. In the top view of FIG. 2(a), a first quantum bit substrate 10 and a second quantum bit substrate 11 that would normally be opaque are illustrated as transparent so that a disposition of superconductive wirings 13 is clearly seen. The device of the first embodiment has a structure in which the first quantum bit substrate 10 and the second quantum bit substrate 11 are flip-chip connected on a base substrate 12 having the superconductive wirings 13 extending parallel to each other. A superconductive magnetic flux quantum bit 14 is disposed on each of the first quantum bit substrate 10 and the second quantum bit substrate 11, and furthermore, the superconductive wirings 13 are disposed to surround at least a part of the superconductive magnetic flux quantum bits 14 to be magnetically coupled to the superconductive magnetic flux quantum bits 14.

Two end portions of the superconductive wiring 13 on the first quantum bit substrate 10 and two end portions on one side of the two superconductive wirings 13 on the base substrate 12 are joined via superconductive solder bumps 15. Similarly, two end portions of the superconductive wiring 13 on the second quantum bit substrate 11 and two end portions on the other side of the two superconductive wirings 13 on the base substrate 12 are joined via superconductive solder bumps 15. As a result, one continuous superconductive loop including the superconductive wiring 13 and the superconductive solder bumps 15 on the base substrate 12, and the superconductive wiring 13 on the first quantum bit substrate 10 and the superconductive wiring 13 on the second quantum bit substrate 11 is formed. With this superconductive loop, the superconductive magnetic flux quantum bit 14 on the first quantum bit substrate 10 and the superconductive magnetic flux quantum bit 14 on the second quantum bit substrate 11 are magnetically coupled. Further, a case in which there is one superconductive loop for coupling the superconductive magnetic flux quantum bits 14 is illustrated in FIGS. 1 and 2, but a plurality of superconductive loops may be coupled in series.

As a material of the first quantum bit substrate 10, the second quantum bit substrate 11, and the base substrate 14, a material generally used as a substrate of a metal superconductive device such as silicon or sapphire can be used. As a material of the superconductive magnetic flux quantum bit 14 and the superconductive wiring 13, a metal superconductor such as niobium, niobium nitride, aluminum, indium, rhenium, tantalum, or titanium nitride can be used. As a material of the superconductive solder bump 15, a metal superconductor such as lead, tin, or indium, or an alloy thereof can be used. When the present embodiment is used, the superconductive magnetic flux quantum bits 14 on different substrates can be coupled, and a quantum annealing machine can be extended to one or more quantum bit substrate regions.

Second Embodiment

Figure 3:
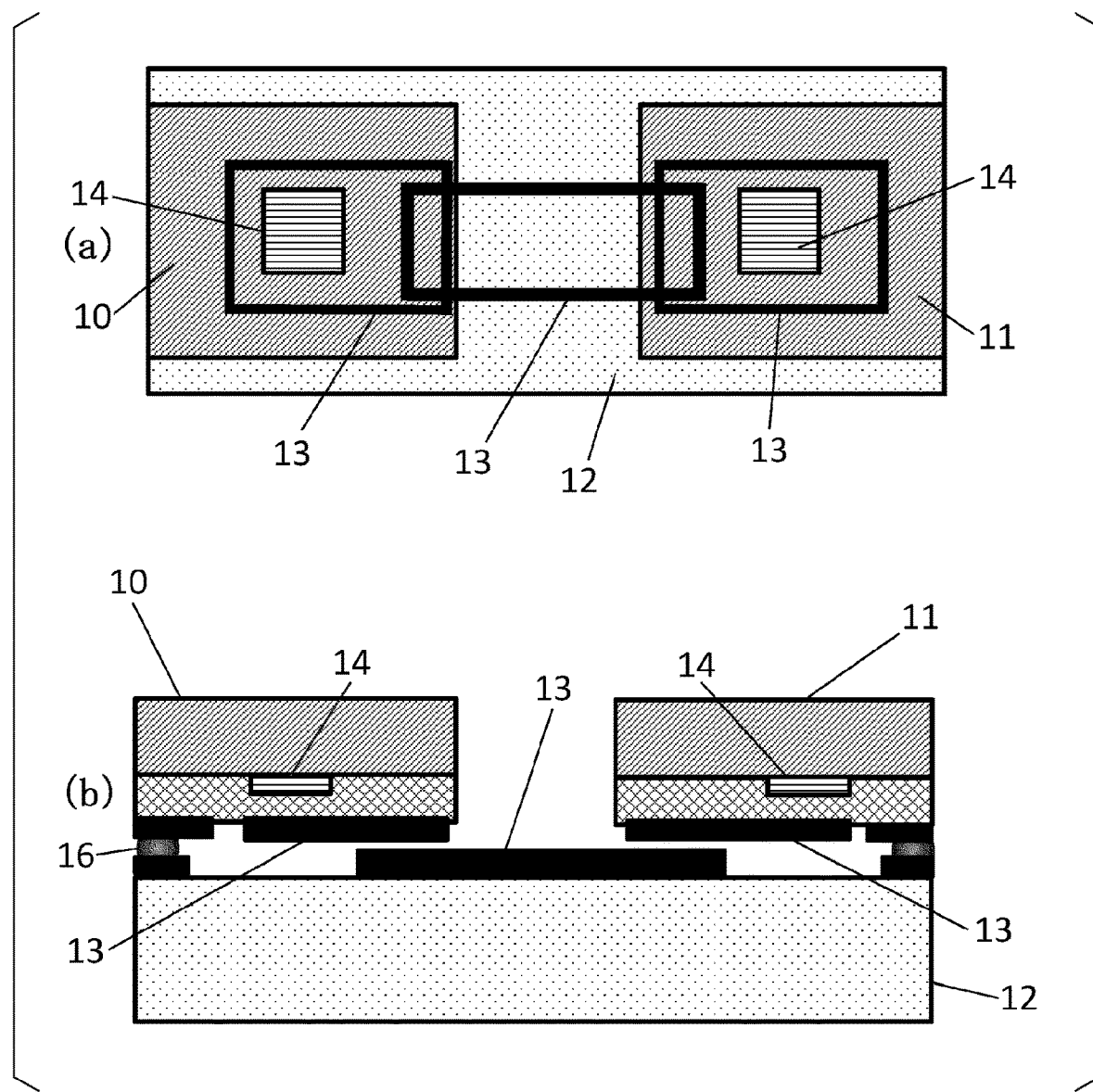
FIG. 3(a) is a top view and FIG. 3(b) is a cross-sectional view of the quantum bit device of the second embodiment.

A quantum bit device of a second embodiment of the present invention will be described with reference to FIGS. 1 and 3. FIG. 3(a) is a top view and FIG. 3(b) is a cross-sectional view of a central portion of FIG. 1. Further, in the top view of FIG. 3(a), a first quantum bit substrate 10 and a second quantum bit substrate 11 that would normally be opaque are illustrated as transparent so that a disposition of superconductive wirings 13 is clearly seen. A device of the second embodiment has a structure in which the first quantum bit substrate 10 and the second quantum bit substrate 11 are flip-chip connected on a base substrate 12 having the superconductive wirings 13. Here, the solder bumps 16 used for the flip-chip connection need not be superconductors. A superconductive magnetic flux quantum bit 14 is disposed on each of the first quantum bit substrate 10 and the second quantum bit substrate 11, and furthermore, the superconductive wirings 13 are respectively disposed to surround at least a part of the superconductive magnetic flux quantum bits 14 to be magnetically coupled to the superconductive magnetic flux quantum bits 14.

The first quantum bit substrate 10 and the second quantum bit substrate 11 are flip-chip connected on the base substrate 12 plate so that each of surfaces thereof faces a surface of the base substrate 12, and there is an air gap between the superconductive wiring 13 on the base substrate 12, and the superconductive wiring 13 on the first quantum bit substrate 10 and the superconductive wiring 13 on the second quantum bit substrate 11. The three superconductive wirings 13 abutting on the air gap can form magnetic coupling via inductance. When the present embodiment is used, the superconductive magnetic flux quantum bits 14 on different substrates can be coupled without using the superconductive solder bumps 15 that have been essential in the first embodiment, and a quantum annealing machine can be extended to a region of one or more substrates.

Third Embodiment

Figure 4:
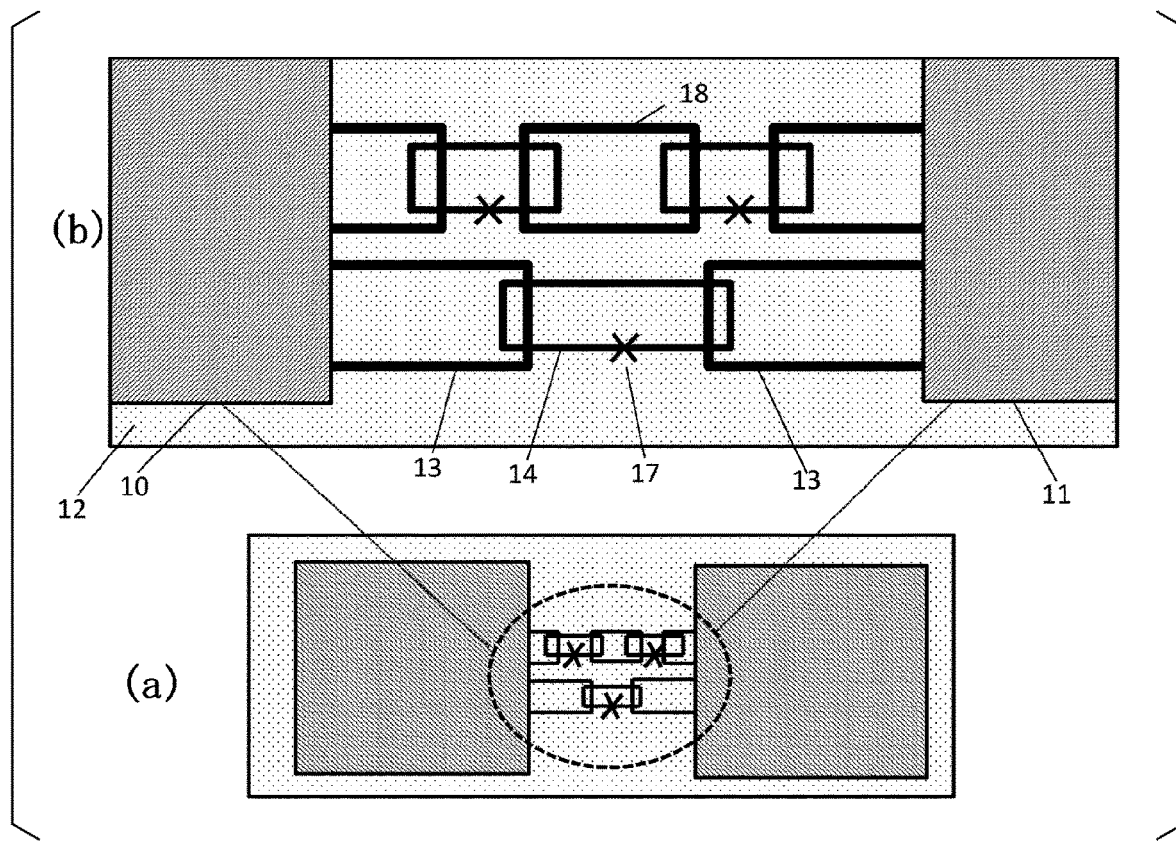
FIG. 4(a) is a top view and FIG. 4(b) is a cross-sectional view of a quantum bit device of a third embodiment.

A quantum bit device of a third embodiment of the present invention will be described with reference to FIG. 4. FIG. 4(a) is a top view of a device for explaining the present embodiment, and FIG. 4(b) is an enlarged view of a central portion thereof. In the present embodiment, a superconductive magnetic flux quantum bit 14 which is a superconductive loop having a Josephson junction 17 is disposed on a base substrate 12. In FIG. 4, three superconductive magnetic flux quantum bits 14 are disposed on the base substrate 12 as an example, but the number is not limited to three and may include one or more. As described in the first embodiment and the second embodiment, the superconductive magnetic flux quantum bits 14 on the base substrate 12 can be magnetically coupled to the superconductive magnetic flux quantum bit 14 on a first quantum bit substrate 10 and the superconductive magnetic flux quantum bit 14 on a second quantum bit substrate 11 via a superconductive wiring 13.

Generally, when a length of a superconductive loop that couples superconductive magnetic flux quantum bits increases, there is a problem in that a coupling efficiency deteriorates, but when the superconductive magnetic flux quantum bits 14 are disposed on the base substrate 12, the superconductive magnetic flux quantum bits can be coupled using a short distance superconductive loop, and the coupling efficiency between the superconductive magnetic flux quantum bits is improved. As illustrated in FIG. 4, when a plurality of superconductive magnetic flux quantum bits 14 are disposed on the base substrate 12, since a length of a superconductive loop 17 can be made small by connecting the superconductive magnetic flux quantum bits 14 with superconductive loops 18 on the base substrate 12, the coupling efficiency of the quantum bits is further improved. Also, when the superconductive magnetic flux quantum bits 14 on the base substrate 12 are used as a part of a quantum annealing machine network, a more efficient network can be formed. When the present embodiment is used, a plurality of substrates having the superconductive magnetic flux quantum bits can be disposed while maintaining strong coupling between the superconductive magnetic flux quantum bits, and the quantum annealing machine can be extended to a region of one or more substrates.

Fourth Embodiment

Figure 5:
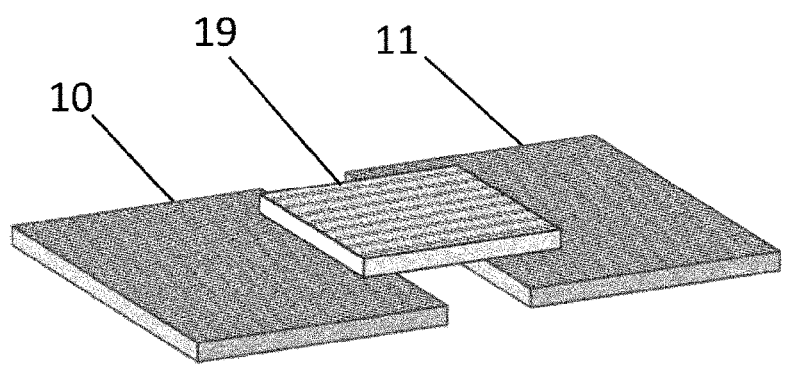
FIG. 5 is a perspective view of a quantum bit device of a fourth embodiment.
Figure 6:
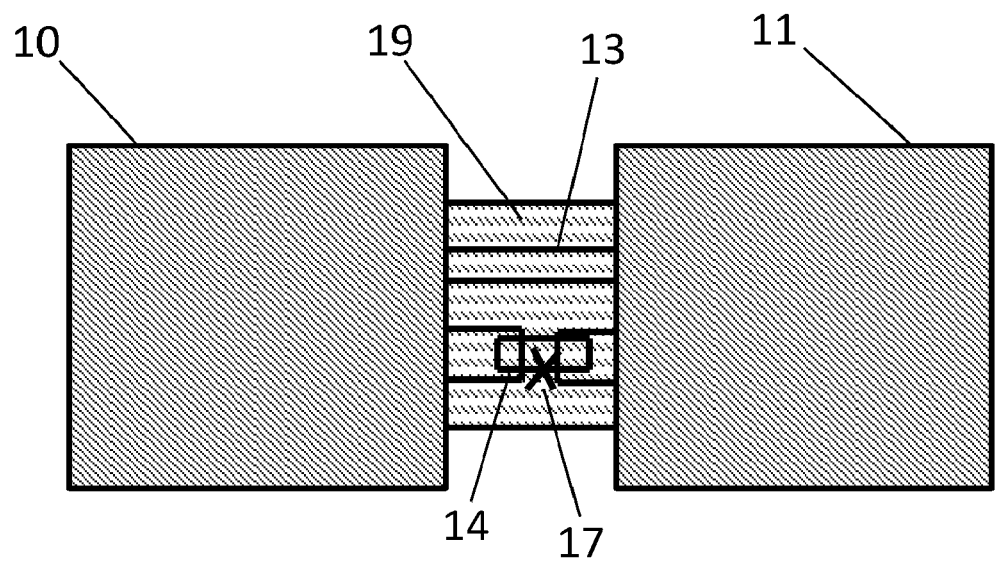
FIG. 6 is a back view of the quantum bit device of the fourth embodiment.
Figure 7:
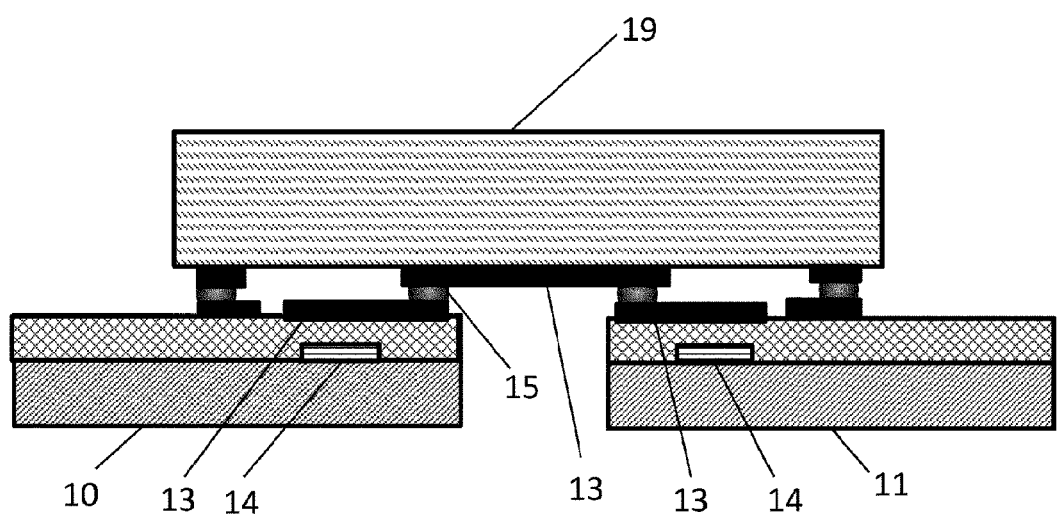
FIG. 7 is a cross-sectional view of the quantum bit device of the fourth embodiment.
Figure 8:
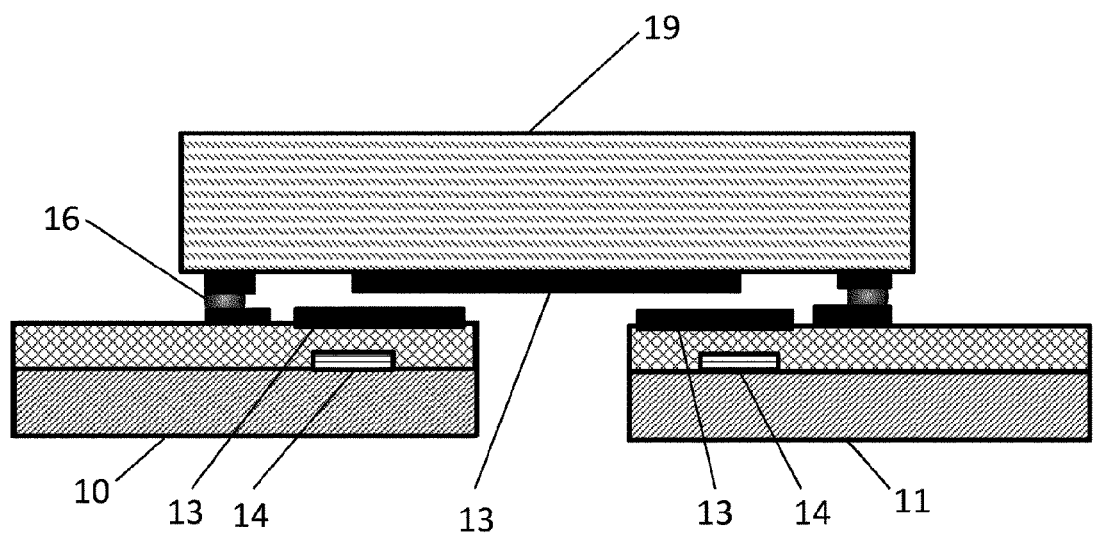
FIG. 8 is a cross-sectional view of the quantum bit device of the fourth embodiment.

A quantum bit device of a fourth embodiment of the present invention will be described with reference to FIGS. 5, 6, 7, and 8. FIG. 5 is a perspective view for explaining the fourth embodiment, FIG. 6 is a view of the structure of FIG. 5 from a back side, and FIGS. 7 and 8 are cross-sectional views in the vicinity of a center. As illustrated in FIG. 5, the present embodiment has a structure in which a connection substrate 19 is flip-chip connected in a form of straddling a first quantum bit substrate 10 and a second quantum bit substrate 11. A size (surface area) of the connection substrate 19 can be selected to be smaller than sizes of the first quantum bit substrate 10 and the second quantum bit substrate 11. As illustrated in FIG. 6 in which the structure of FIG. 5 is viewed from the back side, any one of a disposition of a superconductive wiring 13 as in the first embodiment, a disposition of a superconductive wiring 13 as in the second embodiment, and a disposition of a superconductive wiring 13 and a superconductive magnetic flux quantum bit 14 as in the third embodiment is selected and disposed on the connection substrate 19.

In the cross-sectional view of FIG. 7, as in the first embodiment, one continuous superconductive loop including the superconductive wiring 13 and a superconductive solder bump 15 which are provided on the connection substrate 19, the superconductive wiring 13 on the first quantum bit substrate, and the superconductive wiring 13 on the second quantum bit substrate 11 is formed. Using this superconductive loop, the superconductive magnetic flux quantum bit 14 magnetically coupled to the superconductive wiring 13 provided on the first quantum bit substrate 10 and the superconductive magnetic flux quantum bit 14 magnetically coupled to the superconductive wiring 13 provided on the second substrate 11 can be coupled. Also, as in the second embodiment, the superconductive wiring 13 on the connection substrate 19 can be magnetically coupled to the superconductive wiring 13 on the first quantum bit substrate 10 and the superconductive wiring 13 on the second quantum bit substrate 11 with an air gap therebetween, and thus the superconductive solder bumps 15 in these portions can be removed as illustrated in the cross-sectional view of FIG. 8.

As illustrated in FIG. 6, as in the third embodiment, it is also possible to dispose the superconductive magnetic flux quantum bit 14, which is a superconductive loop having a Josephson junction 17, on the connection substrate 19 and provide the superconductive wiring 13 at both ends thereof via magnetic coupling. In the structures described in the first to fourth embodiments, while a combined surface area (size) of the first quantum bit substrate 10 and the second quantum bit substrate 11 has been required to be smaller than that of the connection substrate 12, when the present embodiment is used, substrates having a larger surface area than the connection substrate 17 can be used for the first quantum bit substrate 10 and the second quantum bit substrate 11, and thereby a larger-scale quantum annealing machine can be configured.

Fifth Embodiment

Figure 9:
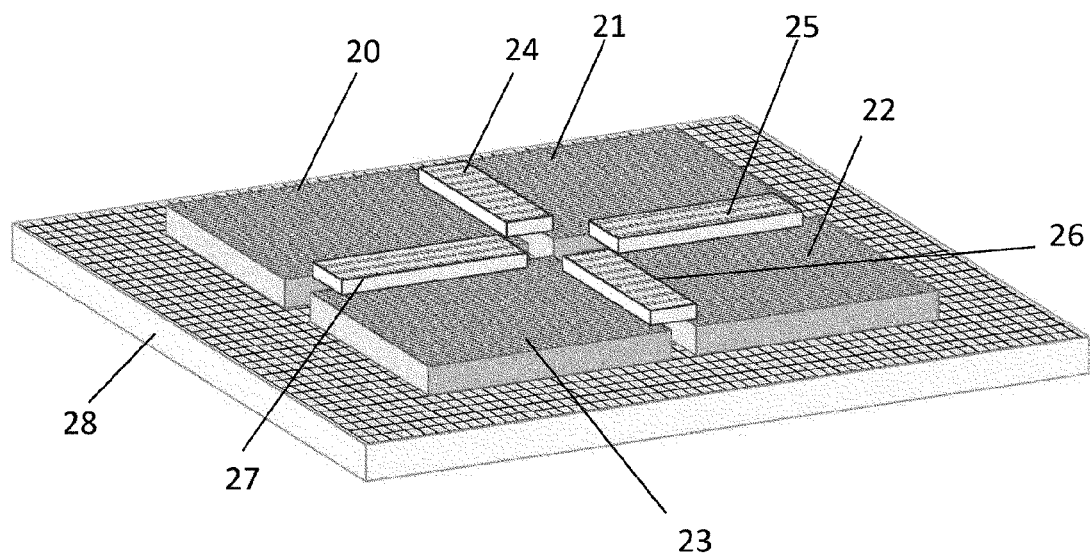
FIG. 9 is a perspective view of a quantum bit device of a fifth embodiment.

A quantum bit device of a fifth embodiment of the present invention will be described with reference to FIGS. 9 and 10. FIG. 9 is a perspective view for explaining the fifth embodiment. In FIG. 9, a first quantum bit substrate 20 and a second quantum bit substrate 21 are flip-chip connected by a first connection substrate 24. Similarly, the second quantum bit substrate 21 and a third quantum bit substrate 22 are flip-chip connected by a second connection substrate 25. The third quantum bit substrate 22 and a fourth quantum bit substrate 23 are flip-chip connected by a third connection substrate 26. Also, the fourth quantum bit substrate 32 and the first quantum bit substrate 20 are flip-chip connected by a fourth connection substrate 27. Here, the first connection substrate 24, the second connection substrate 25, the third connection substrate 26, and the fourth connection substrate 27 have the same structure as the connection substrate 19 described in the fourth embodiment. All the above-described structures are disposed on a base substrate 28.

Figure 10:
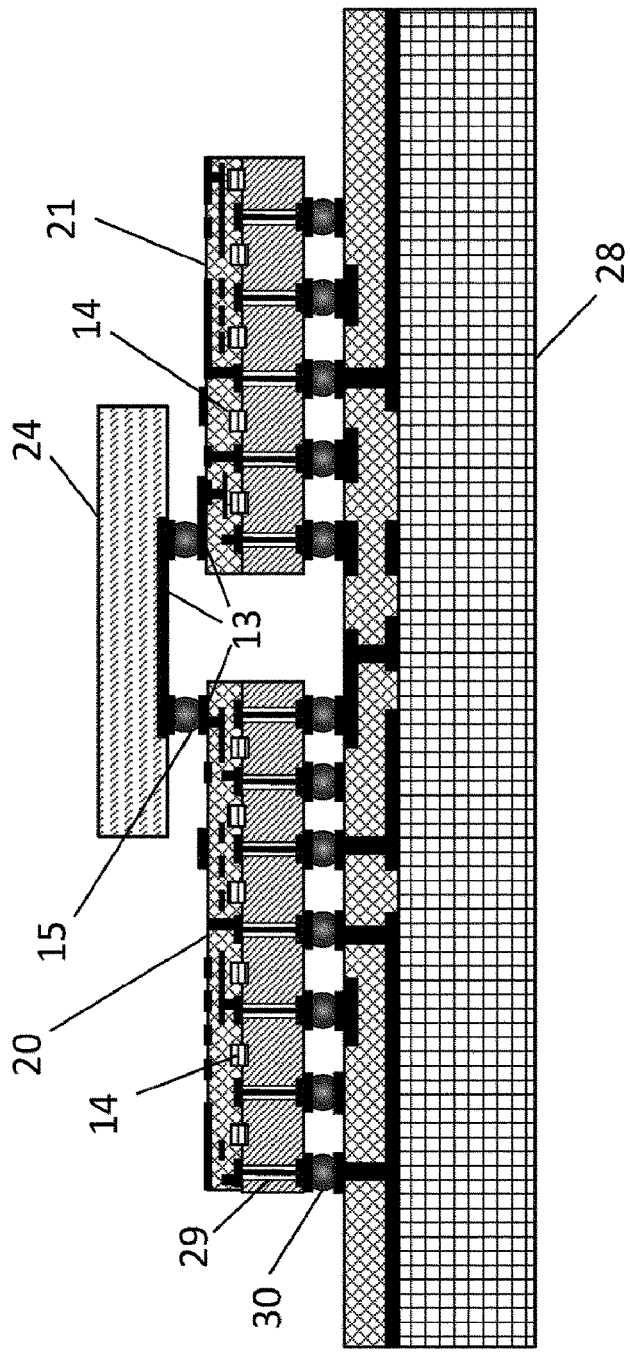
FIG. 10 is a cross-sectional view of the quantum bit device of the fifth embodiment.

FIG. 10 is a view illustrating a partial cross-sectional structure of the first quantum bit substrate 20, the second quantum bit substrate 21, the first connection substrate 24, and the base substrate 28 of the present embodiment. A superconductive magnetic flux quantum bit 14 disposed on the first quantum bit substrate 20 and a superconductive magnetic flux quantum bit 14 disposed on the second quantum bit substrate 21 are magnetically coupled via a superconductive loop configured by a superconductive wiring 13 on the first quantum bit substrate 20, a superconductive wiring 13 on the second quantum bit substrate 21, a superconductive wiring 13 on the first connection substrate 24, and superconductive solder bumps 15. Here, the first to fourth connection substrates have the same structure as the connection substrate 19 described in the fourth embodiment.

In detail, a through-via 29 provided in the first quantum bit substrate 20, the second quantum bit substrate 21, the third quantum bit substrate 22, and the fourth quantum bit substrate 23 are filled with the above-described superconductor such as tin or a metal having high conductivity such as copper using a method such as plating. A power supply line, an input line, and an output line of a quantum annealing machine connected to the outside are connected to circuits on the first quantum bit substrate 20 and the second quantum bit substrate 21 from the base substrate 28 via solder bumps 30 and the through-vias 29 filled with the metal. When the present embodiment is used, wirings for the power supply line, the input line, and the output line necessary for an operation of the quantum annealing machine on the first quantum bit substrate 20, the second quantum bit substrate 21, the third quantum bit substrate 22, and the fourth quantum bit substrate 23 can be greatly reduced, and an installation area of the quantum annealing machine main body can be increased.

Sixth Embodiment

Figure 11:
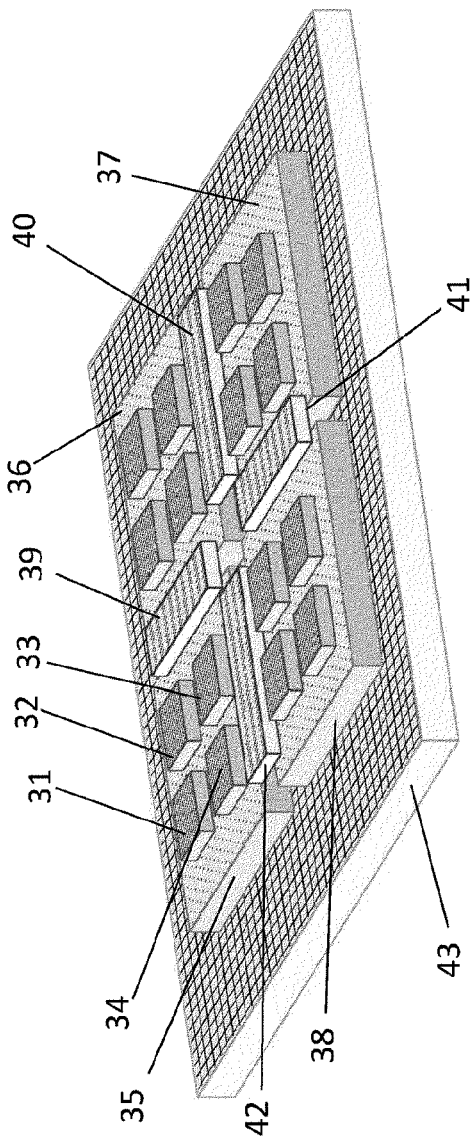
FIG. 11 is a perspective view of a quantum bit device of a sixth embodiment.

A quantum bit device of a sixth embodiment of the present invention will be described with reference to FIGS. 11 and 12. FIG. 11 is a perspective view for explaining the present embodiment. In FIG. 11, a first quantum bit substrate 31, a second quantum bit substrate 32, a third quantum bit substrate 33, and a fourth quantum bit substrate 34 are flip-chip connected on a first interposer substrate 35. A connection between quantum bits provided on these four quantum bit substrates 31 to 34 is performed on the first interposer substrate 35 using any one of the methods in the first embodiment, the second embodiment, and the third embodiment described above or a method in which they are combined. Similarly, four quantum bit substrates are flip-chip connected also on each of a second interposer substrate 36, a third interposer substrate 37, and a fourth interposer substrate 38.

Superconductive magnetic flux quantum bits 14 disposed on the first interposer substrate 35 and the adjacent second interposer substrate 36 can be coupled using a first connection substrate 39 that is flip-chip connected to both the interposer substrates. The connection of the superconductive magnetic flux quantum bits 14 provided on the first interposer substrate 35 and the second interposer substrate 36 is performed using the method described in the fourth embodiment. Similarly, the second interposer substrate 36 and the third interposer substrate 37, the third interposer substrate 37 and the fourth interposer substrate 38, and the fourth interposer substrate 38 and the first interposer substrate 35 are respectively flip-chip connected to a second connection substrate 40, a third connection substrate 41, and a fourth connection substrate 42, and thereby superconductive magnetic flux quantum bits installed thereon can be connected. Thereby, a large-scale quantum annealing machine in which the superconductive magnetic flux quantum bits disposed on the 16 quantum bit substrates are coupled can be configured. The first interposer substrate 35, the second interposer substrate 36, the third interposer substrate 37, and the fourth interposer substrate 38 are disposed on a base substrate 43.

Figure 12:
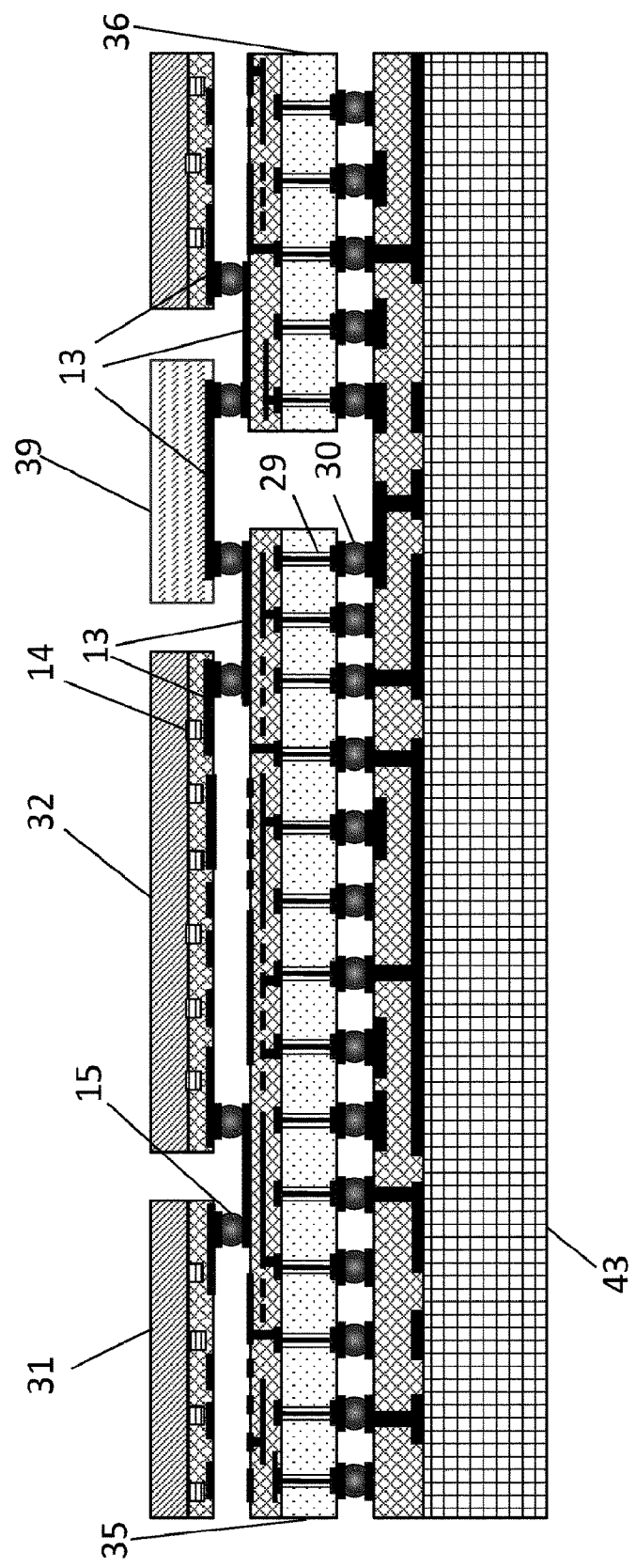
FIG. 12 is a cross-sectional view of the quantum bit device of the sixth embodiment.

FIG. 12 is a partial cross-sectional view of the first interposer substrate 35, the first connection substrate 39, the second interposer substrate 36, and the base substrate 43. The first quantum bit substrate 31 and the second quantum bit substrate 32 are flip-chip connected to the first interposer substrate 35, and the superconductive magnetic flux quantum bits 14 installed on the respective substrates are connected using the method described in the first embodiment. The first interposer substrate 35 is connected to the second interposer substrate 36 to which the superconductive magnetic flux quantum bit substrates are flip-chip connected in the same manner by flip-chip connection of the first connection substrate 39, and the superconductive magnetic flux quantum bits on the quantum bit substrates which are flip-chip connected to the respective interposer substrates are connected by a superconductive loop using superconductive wirings 13 and superconductive solder bumps 15 as described in the first embodiment and the fourth embodiment.

Through-vias 29 are provided in the first interposer substrate 35 and the second interposer substrate 36 and placed on the base substrate 43 via solder bumps 30. A power supply line, an input line, and an output line of the quantum annealing machine connected to the outside are connected to circuits on the interposer substrates from the base substrate 43 via the solder bumps 30 and the through-vias 29. Here, the through-vias are filled with a superconductor such as tin or a metal having high conductivity such as copper using a method such as plating. When the present embodiment is used, a quantum annealing machine in which a large number of quantum bit substrates are efficiently connected can be realized, and a large-scale quantum annealing machine in which the number of quantum bits far exceeds the number of quantum bits that can be mounted on one quantum bit substrate can be realized. Also, a larger quantum annealing machine can also be realized by repeating the structure of the present embodiment.

Embodiments of the present invention have been described with reference to the drawings. However, the present invention is not limited to the embodiments. Further, the present invention can be implemented by aspects to which various improvements, modifications, and changes are added on the basis of knowledge of those skilled in the art in a scope without departing from the spirit of the present invention.

INDUSTRIAL APPLICABILITY

The quantum bit device of the present invention can be industrially used as a quantum annealing machine capable of changing and extending the number of quantum bits as required.

REFERENCE SIGNS LIST 10, 20, 31 First quantum bit substrate
11, 21, 32 Second quantum bit substrate
12, 28, 43 Base substrate
13 Superconductive wiring
14 Superconductive magnetic flux quantum bit
15 Superconductive solder bump
16, 30 Solder bump
17 Josephson junction
18 Superconductive loop
19 Connection substrate
22, 33 Third quantum bit substrate
23, 34 Fourth quantum bit substrate
24, 39 First connection substrate
25, 40 Second connection substrate
26, 41 Third connection substrate
27, 42 Fourth connection substrate
29 Through-via
35 First interposer substrate
36 Second interposer substrate
37 Third interposer substrate
38 Fourth interposer substrate

The invention claimed is:
1. A quantum bit device comprising:
a first quantum bit substrate which includes a first superconductive wiring disposed to have a magnetically coupled portion with a first superconductive magnetic flux quantum bit on a surface thereof;

a second quantum bit substrate which includes a second superconductive wiring disposed to have a magnetically coupled portion with a second superconductive magnetic flux quantum bit on a surface thereof; and a base substrate which includes a third superconductive wiring configured by two superconductive wirings extending parallel to each other on a surface thereof, wherein the first and second quantum bit substrates are placed on the base substrate, two end portions of the first superconductive wiring and two end portions on one side of the third superconductive wiring are joined via superconductive solders, two end portions of the second superconductive wiring and two end portions on the other side of the third superconductive wiring are joined via superconductive solders, and three of the first to third superconductive wirings form one continuous superconductive loop.

2. A quantum bit device comprising:

a first quantum bit substrate which includes a first superconductive loop having a superconductive wiring forming one closed loop disposed to have a magnetically coupled portion with a first superconductive magnetic flux quantum bit on a surface thereof;

a second quantum bit substrate which includes a second superconductive loop having a superconductive wiring forming one closed loop disposed to have a magnetically coupled portion with a second superconductive magnetic flux quantum bit on a surface thereof;

a base substrate which includes a third superconductive loop having a superconductive wiring forming one closed loop on a surface thereof;

at least one of third superconductive magnetic flux quantum bits formed on the surface of the base substrate; and a plurality of the third superconductive loops formed on the surface of the base substrate to be able to be magnetically coupled to at least one of the two of the first to second superconductive loops through the third superconductive magnetic flux quantum bits and the third superconductive loops, wherein the first quantum bit substrate and the second quantum bit substrate are flip-chip connected on the base substrate so that the respective surfaces face the surface of the base substrate, and the first and second superconductive loops are able to be magnetically coupled to the third superconductive loop with an air gap therebetween, as viewed from the direction perpendicular to the substrate, one part of a third region surrounded by the third superconductive loop is overlapped with one part of a first region surrounded by the first superconductive loop, and the other one part of the third region is overlapped with a part of a second region surrounded by the second superconductive loop, and the one part of the third region is surrounded by one of the plurality of the third superconductive loops and the other one part of the third region is surrounded by the other one of the plurality of the third superconductive loops.

3. A quantum bit device comprising:

a first quantum bit substrate which includes a first superconductive wiring disposed to have a magnetically coupled portion with a first superconductive magnetic flux quantum bit on a surface thereof;

a second quantum bit substrate which includes a second superconductive wiring disposed to have a magnetically coupled portion with a second superconductive magnetic flux quantum bit on a surface thereof; and a connection substrate including a third superconductive wiring configured by two superconductive wirings extending parallel to each other on a surface thereof and having a size smaller than those of the first and second quantum bit substrates, wherein the connection substrate is placed so that the surface faces the surfaces of the first and second quantum bit substrates and straddles the first quantum bit substrate and the second quantum bit substrate, two end portions of the first superconductive wiring and two end portions on one side of the third superconductive wiring are joined via superconductive solders, two end portions of the second superconductive wiring and two end portions on the other side of the third superconductive wiring are joined via superconductive solders, and three of the first to third superconductive wirings form one continuous superconductive loop.

4. The quantum bit device according to claim 3, further comprising:

a base substrate on which the first and second quantum bit substrates are placed, wherein a wiring on the base substrate is connected to through conductive vias in the first and second quantum bit substrates and wirings thereon via solders.

5. A quantum bit device comprising:

a first quantum bit substrate which includes a first superconductive loop having a superconductive wiring forming one closed loop disposed to have a magnetically coupled portion with a first superconductive magnetic flux quantum bit on a surface thereof;

a second quantum bit substrate which includes a second superconductive loop having a superconductive wiring forming one closed loop disposed to have a magnetically coupled portion with a second superconductive magnetic flux quantum bit on a surface thereof;

a connection substrate which includes a plurality of third superconductive loop having a superconductive wiring forming one closed loop on a surface thereof and having a size smaller than those of the first and second quantum bit substrates; and at least one of third superconductive magnetic flux quantum bits formed on the surface of the connection substrate, wherein the connection substrate is flip-chip connected on the first and second quantum bit substrates so that the surface faces the surfaces of the first and second quantum bit substrates and straddles the first quantum bit substrate and the second quantum bit substrate, the first and second superconductive loops are able to be magnetically coupled to the third superconductive loop with an air gap therebetween, and as viewed from the direction perpendicular to the substrate, one part of a third region surrounded by the third superconductive loop is overlapped with one part of a first region surrounded by the first superconductive loop, and the other one part of the third region is overlapped with a part of a second region surrounded by the second superconductive loop, the plurality of the third superconductive loops are configured to be magnetically coupled to at least one of the two of the first to second superconductive loops through the third superconductive magnetic flux quantum bits and the third superconductive loops, and the one part of the third region is surrounded by one of the plurality of the third superconductive loops and the other one part of the third region is surrounded by the other one of the plurality of the third superconductive loops.

6. A quantum bit device comprising:

a first quantum bit substrate which includes a first superconductive wiring disposed to have a magnetically coupled portion with a first superconductive magnetic flux quantum bit on a surface thereof;

a second quantum bit substrate which includes a second superconductive wiring disposed to have a magnetically coupled portion with a second superconductive magnetic flux quantum bit on a surface thereof;

an interposer substrate including a third superconductive wiring configured by two superconductive wirings extending parallel to each other on a surface thereof; and a base substrate on which the interposer substrate is placed, wherein the first and second quantum bit substrates are placed on the interposer substrate, two end portions of the first superconductive wiring and two end portions on one side of the third superconductive wiring are joined via superconductive solders, two end portions of the second superconductive wiring and two end portions on the other side of the third superconductive wiring are joined via superconductive solders, and three of the first to third superconductive wirings form one continuous superconductive loop, and a wiring on the base substrate is connected to a through conductive via in the interposer substrate and a wiring thereon via a solder.

7. The quantum bit device according to claim 6, comprising at least two interposer substrates on which the first and second quantum bit substrates are placed, and further comprising a connection substrate placed to straddle two adjacent interposer substrates and flip-chip connected, wherein the superconductive wirings on the two interposer substrates are joined to a facing superconductive wiring on the connection substrate via superconductive solders.

* * * * *